United States Patent [19]

Terakado et al.

[11] Patent Number: 5,214,259
[45] Date of Patent: May 25, 1993

[54] METHOD AND APPARATUS FOR FORMING A BALL AT A BONDING WIRE END

[75] Inventors: Yoshimitsu Terakado; Kazumasa Sasakura, both of Tokyo, Japan

[73] Assignee: Kabushiki Kaisha Shinkawa, Tokyo, Japan

[21] Appl. No.: 887,068

[22] Filed: May 22, 1992

[30] Foreign Application Priority Data

May 24, 1991 [JP] Japan .................................. 3-148125

[51] Int. Cl.5 .............................................. B23K 9/00
[52] U.S. Cl. .............................. 219/56.22; 219/56.21; 219/130.31
[58] Field of Search ............... 219/56.21, 56.22, 130.31

[56] References Cited

U.S. PATENT DOCUMENTS 4,687,897 8/1987 McKiel, Jr. .................... 219/56.21

FOREIGN PATENT DOCUMENTS 61-46968 10/1986 Japan .
1-54858 11/1989 Japan .
1-54859 11/1989 Japan .

Primary Examiner—Clifford C. Shaw
Attorney, Agent, or Firm—Koda and Androlia

[57] ABSTRACT

In a method and apparatus for making uniform size balls at the end of bonding wires, a constant current circuit is installed between a high voltage power source and a discharge electrode so that a constant high voltage is applied between the bonding wire end and the discharge electrode and a discharge voltage is detected by a discharge voltage detecting circuit so that the thus detected discharge voltage is converted into a time so that a discharge time setting circuit which controls the constant current circuit regulates the discharge time period of the high voltage.

3 Claims, 2 Drawing Sheets

METHOD AND APPARATUS FOR FORMING A BALL AT A BONDING WIRE END

BACKGROUND OF THE INVENTION

1. Field of the Invention

The present invention relates to a method and apparatus that forms a ball at a tip end of bonding wire via electrical discharge.

2. Prior Art

A ball formation apparatus used in a wire bonding machine makes a ball at the end of bonding wire. In such an apparatus, high voltage is applied and discharged between the end of a bonding wire and a discharge electrode. Examples of these kind of apparatuses are shown in the Japanese Patent Application Publication Nos. 61-46968, 1-54858, and 1-54859.

Generally, in the ball forming process, if the distance between the wire end and the discharge electrode differs for each gap, and high voltage from a high-voltage power source is applied to the gap via a constant-current circuit, such inconsistent gaps cause ball formations in different diameters. In other words, since it is necessary to raise the discharge voltage as the gap becomes larger, the diameter of the ball tends to become larger than desired.

In the above-described prior art, no consideration whatsoever is given to how the differences in the gap between the discharge electrodes and the wire ends are compensated. As a result, uniform size balls are not obtainable even though there is a steady application of high-voltage to the gaps.

SUMMARY OF THE INVENTION

Accordingly, the object of this invention is to provide a method and apparatus which makes uniform size balls at the ends of bonding wires.

The object of the present invention is accomplished by a unique method used in an apparatus for forming uniform balls at the ends of bonding wires in which a constant-current circuit is installed between a high-voltage power source and a discharge electrode so that a constant high voltage regulated by the constant-current circuit is discharged between the end of a bonding wire and the discharge electrode, and the unique method according to the present invention is that in such a bonding wire ball formation apparatus the discharge voltage at the time of high voltage discharge is detected, and the high voltage discharge time is regulated by the constant-current circuit in response to changes in the thus detected discharge voltage.

On the other hand, the unique structure according to the present invention is that the bonding wire ball formation apparatus as described above further includes a discharge voltage detecting circuit which detects the discharge voltage at the time of discharge, a V-T converter which converts the detected discharge voltage into a time value, and a discharge time setting circuit which regulates the time of discharge in response to the time value obtained by the V-T converter. With this structure, the high voltage discharge time is controlled by the constant-current circuit in accordance with changes in the discharge voltage.

Because the discharge time regulated by the constant-current circuit is controlled in accordance with the changes in the discharge voltage via the discharge time setting circuit, the voltage (or energy) which is applied to the wire end can be kept constant. In other words, when the discharge voltage is high, the discharge time is shortened; and when the discharge voltage is low, the discharge time is extended. In this way, balls that are uniform in diameter may always be obtained at the ends of bonding wires.

DETAILED DESCRIPTION OF THE INVENTION

Figure 1:
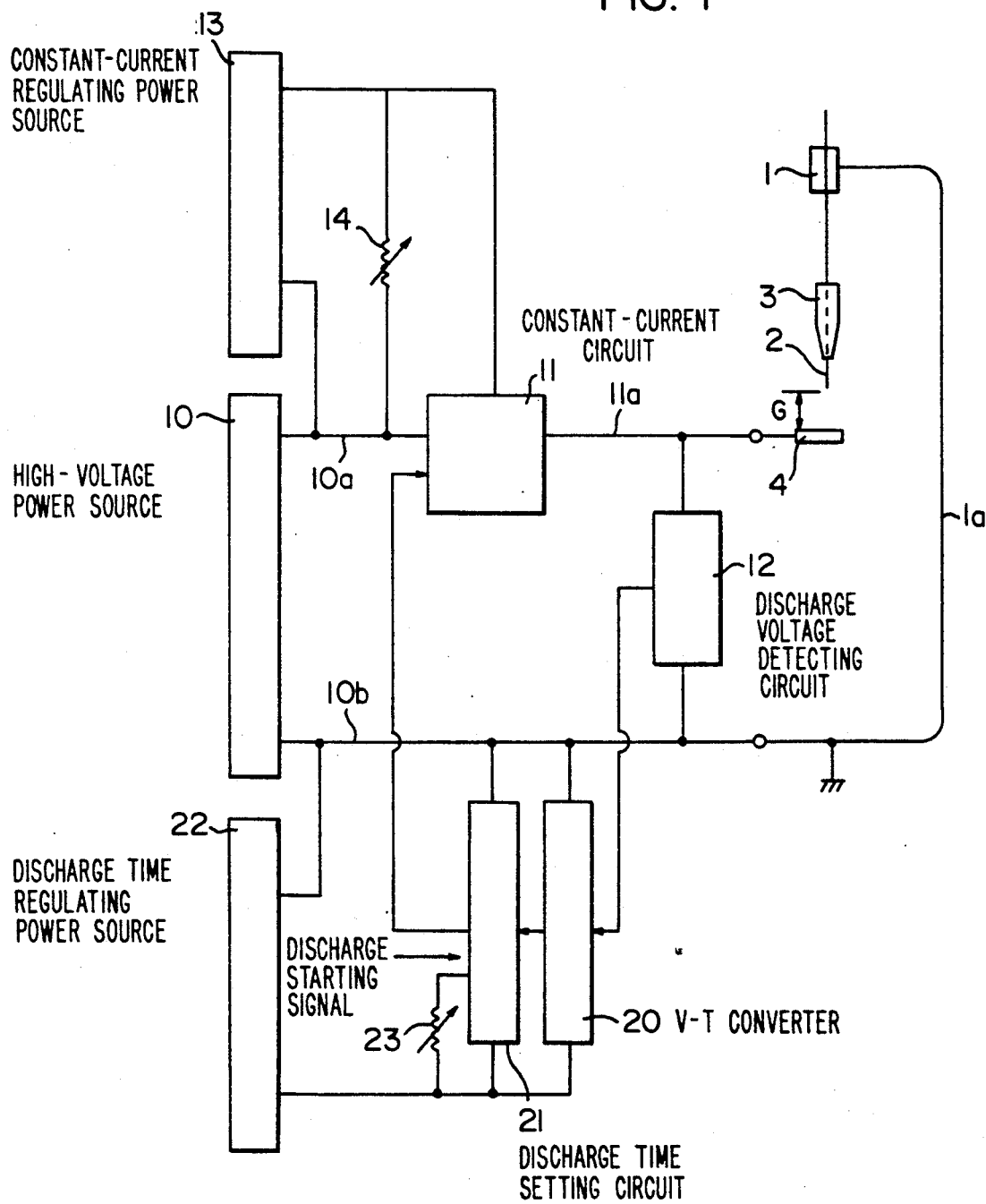
FIG. 1 is a circuit diagram showing an embodiment of the present invention.

One embodiment of the present invention will be described below with reference to FIG. 1.

At the time of ball formation, a bonding wire 2 is held by a clamp 1, and discharge electrode 4 is moved so that it comes underneath the capillary 3 with a predetermined-size gap left between the end of the wire 3, that passes though the capillary 3, and the electrode 4. High-voltage is then applied to the discharge electrode 4 and discharged, via a ball formation apparatus (detailed below), into the gap between the end of the bonding wire 2 and the discharge electrode 4, thus forming a ball at the end of the bonding wire 2.

The ball formation apparatus is constructed in the following manner.

A first output line 10a of the high-voltage power source 10 is connected to an input port of a constant-current circuit 11, and an output line 11a of the constant-current circuit 11 is connected to the discharge electrode 4. Second output line 10b of the high-voltage power source 10 and a connecting line 1a that is hooked to the clamp 1 are grounded, respectively. A discharge voltage detecting circuit 12, which detects the discharge voltage, is connected to the output line 11a and to the second output line 10b.

Voltage is applied to the constant-current circuit 11 by a constant-current regulating power source 13. It is designed such that the discharge current of the constant-circuit 11 is set by means of discharge current variable resistor 14.

The discharge voltage detected by the discharge voltage detecting circuit 12 is inputted into V-T converter 20 which converts voltage into a time value. The output of the V-T converter 20 is inputted into a discharge time setting circuit 21, and the discharge time which is set beforehand in the discharge time setting circuit 21 is corrected accordingly; and then the discharge time of the constant-current circuit 11 is regulated by the corrected discharge time which is outputted by the discharge time setting circuit 21.

Voltage is applied to both the V-T converter 20 and the discharge time setting circuit 21 by discharge time regulating power source 22. The discharge time outputted by the discharge time setting circuit 21 is set by the discharge time variable resistor 23.

The operation of the apparatus described above will be explained below.

At the time of discharge, a discharge starting signal is inputted into the discharge time setting circuit 21, and a trigger for the constant-current circuit 11 is opened by the signal from the discharge time setting circuit 21. As a result, the discharge current determined beforehand by the discharge current variable resistor 14 begins to flow into the constant-current circuit 11. Accordingly, a high-voltage from the high-voltage power source 10 is applied to the tip end of the bonding wire 2 and to the discharge electrode 4 so as to create a discharge of high voltage that forms a ball at the end of bonding wire 2.

In this case, because the discharge voltage is applied to the end of bonding wire 2 and the discharge electrode 4 via the constant-current circuit 11, when the gap G between the tip end of the bonding wire 2 and the discharge electrode 4 changes, the discharge voltage also changes in proportion to the width of the gap G. In other words, as seen from FIG. 2, if the gap G increases, the discharge voltage Y increases as well.

Figure 2:
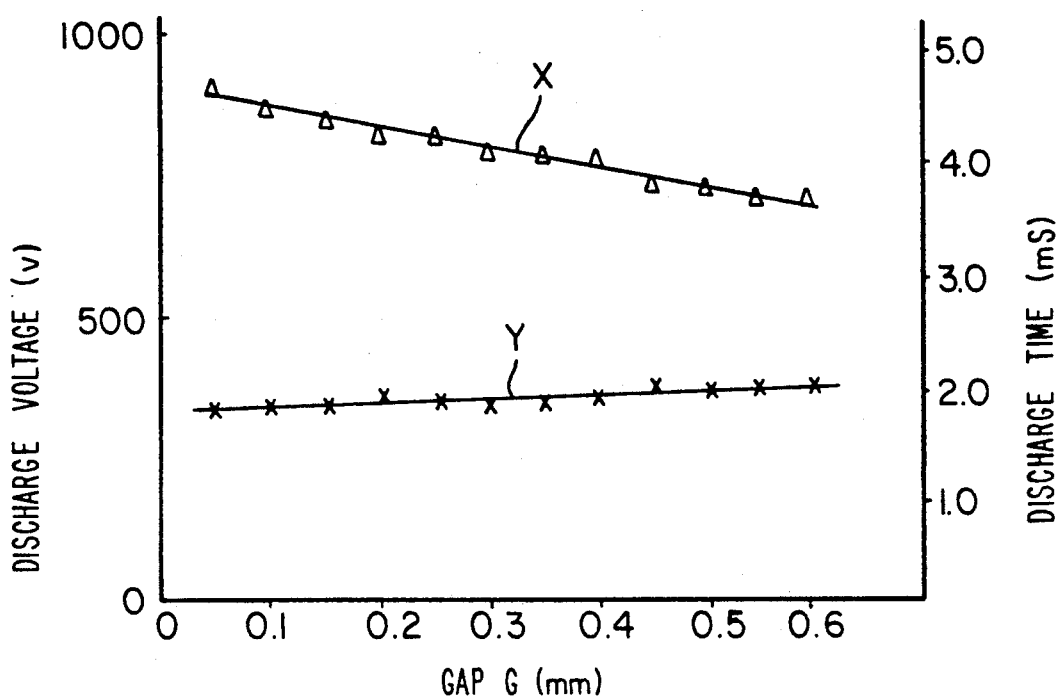
FIG. 2 is a graph showing the relationships between the gap and the discharge voltage and discharge time.

In the present invention, however, the discharge voltage Y applied to the bonding wire 2 and to the discharge electrode 4 is detected by the discharge voltage detecting circuit 12, and this discharge voltage Y is converted into time value by the V-T converter 10, and then the discharge time set beforehand by the discharge time variable resistor 23 is corrected in accordance with the changes in the discharge voltage Y. Furthermore, the constant-current circuit 11 is actuated only for this corrected time period by the discharge time setting circuit 21 so that the time interval during which the high voltage is applied to the tip of the bonding wire 2 and the discharge electrode 4 is regulated. In other words, as shown in FIG. 2, the discharge time X becomes shorter as the discharge voltage Y increases.

Figure 3:
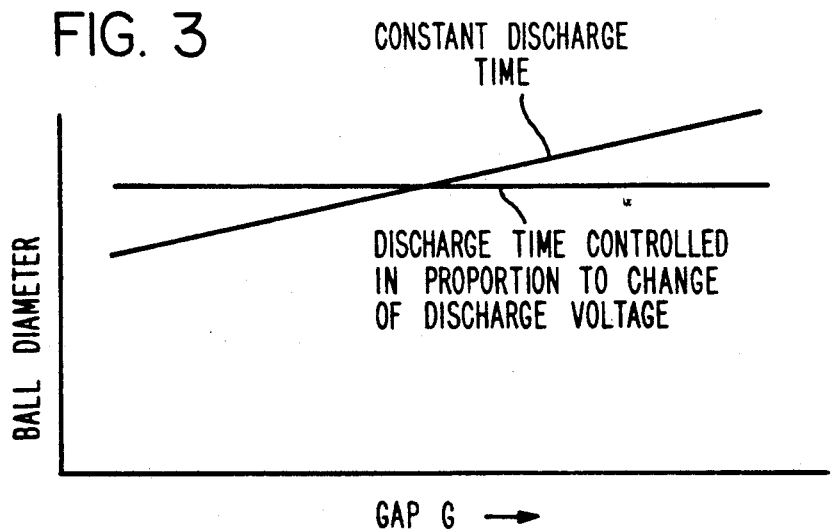
FIG. 3 is a graph showing the relationship between the gap and the ball diameter.

As seen from the above, the discharge time X is regulated in accordance with the changes in the discharge voltage Y; in other words it changes in accordance with the changes in the gap G. Accordingly, the current (energy) which is applied to the bonding wire 2 can be maintained at a constant level, and a uniform ball diameter can be constantly obtained irrespective of changes in the gap G. More specifically, as shown in FIG. 3, if the discharge time is kept constant, ball diameters increase proportionately as the gap G is increased. However, as in the present invention, when the discharge time X is regulated in proportion to the changes in the discharge voltage Y, or in other words to the changes in the gap G a uniform ball diameter may be obtained irrespective of those changes in the gap G.

According to the tests conducted by the inventors, it was determined that uniform diameter balls are obtainable under the condition represented by the Formula 1 below:

$$Y = -0.018 X + 10.8$$

wherein Y is the discharge voltage (volts) and X is the discharge time (mS).

According to the present invention, because the discharge voltage at the moment of discharge of high voltage is detected and the discharge time is regulated based upon the thus detected discharge voltage, a uniform ball diameter can always be obtained.

We claim:

1. A method of forming a ball at an end of a bonding wire in which a high voltage is discharged into a gap between a bonding wire end and a discharge electrode with a discharge current that is controlled to be constant by a constant current circuit installed between a high voltage power source and said discharge electrode, said method being characterized by detecting a magnitude of the discharge voltage at the time of discharge, converting said magnitude into a time valve, and varying a discharge time in accordance with said time value.

2. An apparatus for forming a ball at an end of a bonding wire used in a wire bonding machine wherein a constant current circuit is provided between a high-voltage power source and a discharge electrode so that high voltage is discharged between a bonding wire tip and said discharge electrode with the discharge voltage regulated at a constant level, said apparatus being characterized in that a high voltage discharge time is controlled by said constant current circuit based upon changes in discharge voltage and comprising:

a discharge voltage detecting circuit which detects a magnitude of said discharge voltage at the time of discharge;

a V-T converter which converts the magnitude of the detected discharge voltage into a time value; and a discharge time setting circuit which regulates said discharge time in accordance with said time value of said V-T converter.

3. An apparatus for forming a ball at an end of a bonding wire used in a wire bonding machine wherein a constant current circuit is provided between a high-voltage power source and a discharge electrode so as to discharge high voltage between a bonding wire tip and said discharge electrode with a discharge voltage controlled at a constant level by said constant-current circuit, said apparatus being characterized in that a high voltage discharge time is controlled by said constant current circuit based upon changes in discharge voltage and comprising:

a discharge voltage detecting circuit which is connected to an output line of said constant current circuit and detects a magnitude of said discharge voltage at the time of discharge;

a V-T converter connected to said discharge voltage detecting circuit to convert said magnitude of said detected discharge voltage into a time value; and a discharge time setting circuit installed between said V-T converter and said constant current circuit so as to control a discharge time in accordance with said time value from said V-T converter.

* * * * *